(12) United States Patent  (10) Patent No.: US 7,566,253 B2
Seo  (45) Date of Patent: Jul. 28, 2009

(54) ORGANIC LIGHT EMITTING DEVICE WITH ANODIZED ANODE SURFACE

(75) Inventor: Satoshi Seo, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 19 days.

(21) Appl. No.: 11/268,593

(22) Filed: Nov. 8, 2005

(65) Prior Publication Data

US 2006/0063460 A1 Mar. 23, 2006

Related U.S. Application Data

(62) Division of application No. 09/983,521, filed on Oct. 24, 2001, now Pat. No. 6,992,436.

(30) Foreign Application Priority Data

Oct. 26, 2000 (JP) ............................. 2000-327699

(51) Int. Cl.
 *H01J 9/24* (2006.01)
(52) U.S. Cl. ........................................................ 445/24
(58) Field of Classification Search ................ 313/504, 313/506, 512; 445/24; 156/316
 See application file for complete search history.

(56) References Cited

U.S. PATENT DOCUMENTS

| | | | |
|---|---|---|---|
| 4,587,016 A * | 5/1986 | Sumiyoshi | ............... 210/323.2 |
| 4,857,803 A | 8/1989 | Anderson, Sr. | |
| 4,923,289 A * | 5/1990 | Demiryont | .................. 359/265 |
| 5,100,587 A | 3/1992 | Clough et al. | |
| 5,104,749 A | 4/1992 | Sato et al. | |
| 5,314,775 A * | 5/1994 | Ueda | .......................... 430/58.3 |
| 5,581,091 A | 12/1996 | Moskovits et al. | |

(Continued)

FOREIGN PATENT DOCUMENTS

EP 0 817 281 A2 1/1998

(Continued)

OTHER PUBLICATIONS

Tsutsui et al., "High Quantum Efficiency in Organic Light-Emitting Devices with Iridium-Complex as a Triplet Emissive Center", Japanese Journal of Applied Physics vol. 38, Part 12B, Dec. 15, 1999, pp. L1502-L1504.

(Continued)

*Primary Examiner*—Toan Ton
*Assistant Examiner*—Hana A Sanei
(74) *Attorney, Agent, or Firm*—Nixon Peabody LLP; Jeffrey L. Costellia

(57) ABSTRACT

There is provided a light emitting device and electric equipment, which are bright and have low consumption power and are low in costs. When an organic EL material is made present in a metal oxide porous body including a heavy atom, phosphorescence light emitting of the organic EL material in which only fluorescence is generally observed can be promoted. Thus, an organic EL element in which phosphorescence light emitting is produced is obtained. With respect to this element, since phosphorescence can be used, light emitting efficiency is high. Also, since a conventional organic EL material can be used, it can be manufactured with a low cost. A light emitting device and electric equipment are manufactured using this organic EL element.

7 Claims, 12 Drawing Sheets

U.S. PATENT DOCUMENTS

| | | | |
|---|---|---|---|
| 5,589,733 | A | 12/1996 | Noda et al. |
| 5,616,285 | A | 4/1997 | Zhang |
| 5,703,436 | A * | 12/1997 | Forrest et al. ............... 313/506 |
| 5,874,803 | A | 2/1999 | Garbuzov et al. |
| 5,958,367 | A | 9/1999 | Ying et al. |
| 5,962,962 | A | 10/1999 | Fujita et al. |
| 5,981,092 | A | 11/1999 | Arai et al. |
| 5,989,738 | A | 11/1999 | Haase et al. |
| 6,040,087 | A | 3/2000 | Kawakami |
| 6,157,127 | A | 12/2000 | Hosokawa et al. |
| 6,288,487 | B1 | 9/2001 | Arai |
| 6,291,126 | B2 * | 9/2001 | Wolk et al. .................. 430/200 |
| 6,307,317 | B1 | 10/2001 | Codama et al. |
| 6,370,012 | B1 | 4/2002 | Adae-Amoakoh et al. |
| 6,451,459 | B1 | 9/2002 | Tieke et al. |
| 6,464,853 | B1 | 10/2002 | Iwasaki et al. |
| 6,501,217 | B2 | 12/2002 | Beierlein et al. |
| 6,538,375 | B1 | 3/2003 | Duggal et al. |
| 6,602,918 | B1 | 8/2003 | Ichinose |
| 6,653,701 | B1 | 11/2003 | Yamazaki et al. |
| 2002/0021088 | A1 | 2/2002 | Howard et al. |
| 2002/0064684 | A1 | 5/2002 | Seo |
| 2002/0079836 | A1 | 6/2002 | Tanabe et al. |

FOREIGN PATENT DOCUMENTS

| | | | |
|---|---|---|---|
| JP | 02-288092 | | 11/1990 |
| JP | 04-129194 | A | 4/1992 |
| JP | 07-135080 | | 5/1995 |
| JP | 07-175024 | A | 7/1995 |
| JP | 09-279135 | | 10/1997 |
| JP | 10-045722 | | 2/1998 |
| JP | 10-097895 | | 4/1998 |
| JP | 10270172 | A * | 10/1998 |
| JP | 11-288785 | | 10/1999 |
| JP | 2000-268962 | A | 9/2000 |
| JP | 2000268969 | A * | 9/2000 |
| KR | 1994-0004179 | A | 3/1994 |
| KR | 1998-060829 | | 10/1998 |
| KR | 2000-0073117 | | 12/2000 |
| WO | WO 99/39393 | A1 | 8/1999 |

OTHER PUBLICATIONS

D.F. O'Brien, M.A. Baldo, M.E. Thompson and S.R. Forrest, "Improved energy transfer in electrophosphorescent devices", Applied Physics Letters, vol. 74, No. 3, Jan. 18, 1999, pp. 442-444.

Tsutsui T., "The Operation Mechanism and the Light Emission Efficiency of the Organic El Elment", $3^{rd}$ Lecture Text, Organic Molecular Electronics and Bioelectronics Division, The Japan Society of Applied Physics, 1993, pp. 31-37 (With Full Translation).

Ramamurthy et al., "Heavy-Atom-Induced Phosphorescence of Aromatics and Olefins Included within Zeolites", pp. 3882-3892, 1992, J. Am. Chem. Soc., vol. 114, No. 10.

Nishiguchi et al., Enhancement of the Phosphorescence Yields of Xanthone Included in Alkali-Metal-Cation-Exchanged Zeolites—External Heavy-Atom Effect on the Singlet-Triplet Transitions, pp. 183-188,1994, J. Photochem. Photobiol. A: Chem., 77.

Mori et al., *"Preparation of Uniform Micropores Using Complexes and Their Applications"*, New Microporous, Chemical Society of Japan, vol. 51, No. 2, pp. 210-212, 1998 (Japanese and English).

Takamizawa, *"New Microporous Substance of Transition-Metal Complexes and its Advanced Functions"*, Metal Complexes Capable of Occluding Molecules, Chemical Society of Japan, vol. 53, No. 2, pp. 136-139, 2000 (Japanese and English).

Tang, et al., *"Organic Electroluminescent Diodes"*, Applied Physics Letters, vol. 51, No. 12, pp. 913-915, Sep. 21, 1987.

Tao, et al., *"Blue Photoluminescent Zinc Coordination Polymers With Supertetranuclear Cores"* Chemical Communications pp. 2043-2044, 2000.

Yoshioka, et al., "Zinc (II) Carboxylate Complex Having the Absorption Ability Which Exceeds That of Zeolite" Chemical Society of Japan, vol. 53, No. 11, p. 1332, 2000 (Japanese and English).

Kido Junji, "Basic Knowledge of Organic EL Devices," Monthly Display Special Issue, Organic EL Display: From the Basics to the Latest News, Oct. 20, 1998, pp. 28-29.

Suter, G. et al., "External Heavy-Atom Effect in Room-Temperature Phosphorescence," Analytical Chemistry, Jun. 1, 1987, vol. 59, No. 13, pp. 1644-1646.

Ramasamy, S. et al., "Room-Temperature Phosphorescence of Nitrogen Heterocycles and Aromatic Amines," Analytical Chemistry, Aug. 1, 1982, vol. 54, No. 9, pp. 1642-1644.

Korean Office Action (Application No. 2001-0066288; KR5281) Dated Apr. 21, 2008 with English Translation.

Tsutsui T., "The Operation Mechanism and the Light Emission Efficiency of the Organic Element", Textbook of the 3rd Seminar at Division of Organic Molecular Electronics and Bioelectronics, The Japan Society of Applied Physics, 1993, pp. 31-37.

Mori et al., "Preparation of Uniform Micropores Using Complexes and Their Applications", Chemistry and Chemical Industry, vol. 51, No. 2, 1998, pp. 210-212.

* cited by examiner

ORGANIC LIGHT EMITTING DEVICE WITH ANODIZED ANODE SURFACE

BACKGROUND OF THE INVENTION

1. Field of the Invention

The present invention relates to a light emitting device using as a light source an element (hereinafter referred to as "an organic EL element") which is composed of an anode layer, a cathode layer, and a layer including an organic compound (hereinafter referred to as "an organic compound layer") in which an electroluminescence (hereinafter referred to as "an EL") is generated by applying an electric field thereto. The EL in the organic compound includes luminescence generated when it is returned from a singlet excitation state to a ground state (fluorescence) and luminescence generated when it is returned from a triplet excitation state to a ground state (phosphorescence). In particular, the present invention relates to a light emitting device in which a porous body of an inorganic material is made in contact with an organic compound layer and thus the generation of phosphorescence is promoted. Note that a light emitting device in this specification indicates an image display device or a light emitting device using the organic EL element as a light emitting element. Also, a module in which a TAB (tape automated bonding) tape or a TCP (tape carrier package) is attached to the organic EL element, a module in which a printed wiring board is provided in the end of the TAB tape or the TCP, and a module in which an IC (integrated circuit) is directly mounted on the organic EL element by a COG (chip on glass) method are included in the light emitting device.

2. Description of the Related Art

An organic EL element is an element for emitting light by applying an electric field thereto and noted as a next generation flat panel display element because of characteristics such as lightweight, direct current low voltage drive, and fast response. Also, the organic EL element is a self light emission type and has a wide view angle. Thus, it is considered that the organic EL element is effective as the display screen of a mobile equipment.

It is said that a light emitting mechanism of the organic EL element is said that an electron injected from a cathode and a hole injected from an anode are recombined to form a molecule with an excitation state (hereinafter referred to as "a molecular exciton") and the molecular exciton releases energy to emit light when it is returned to a ground state. As the excitation, a singlet state (S*) and a triplet state (T*) are allowed, and it is considered that its statistical generation ratio is S*:T*=1:3 (Reference 1: Junji Kido, "Monthly Display Separate Volume, Organic EL Display, from Fundamentals to current information" (TechnoTimes Co., Ltd.), pp.28-29).

However, with respect to a general organic compound, light emission (phosphorescence) with the triplet excitation state (T*) is not observed at a room temperature. This is caused even in the case of the organic EL element and only light emission (fluorescence) with the singlet excitation state (S*) is generally observed. Thus, it is assumed that a theoretical limitation of internal quantum efficiency (ratio of the photon generated to the injected carrier) in the organic EL element is 25% based on evidence with S*:T*=1:3.

Also, all generated lights are not emitted to the outside and a portion of the lights cannot be picked up because of the refractive indexes inherent to organic EL element constituent substances (organic compound layer and electrodes) and a substrate. A ratio of the light picked up in the outside to the generated light is called light pickup efficiency. It is said that the pickup efficiency in an organic EL element having a glass substrate is about 20%.

From the above reason, even if all the injected carriers form the molecular excitons, it is said that the theoretical limitation of a ratio of photons (hereinafter referred to as "an external quantum efficiency") finally picked up in the outside of the organic EL element to the number of injected carriers is 25%×20%=5%. That is, even if all the carriers are recombined, only 5% of the recombined carriers are picked up as light according to calculation.

However, recently, organic EL elements capable of converting energy released when it is returned from a triplet excitation state to a ground state (hereinafter referred to as "triplet excitation energy") into light to be emitted are successively reported and these high light emission efficiencies are noted (Reference 2: D. F. O'Brien, M. A. Baldo, M. E. Thompson, and S. R. Forrest, "Improved energy transfer in electrophosphorescent devices", Applied Physics Letters, Vol. 74, No. 3, 442-444 (1999) and Reference 3: Tetsuo Tsutsui, Moon-Jae Yang, Masayuki Yahiro, Kenji Nakamura, Teruichi Watanabe, Taishi Tsuji, Yoshinori Fukuda, Takeo Wakimoto, and Satoshi Miyaguchi, "High Quantum Efficiency in Organic Light-Emitting Devices with Iridium-Complex as a Triplet Emissive Center", Japanese Journal of Applied Physics, Vol. 38, L1502-1504 (1999)).

In Reference 2, a metal complex with platinum as main metal (hereinafter referred to as "a platinum complex") is used. Also, in Reference 3, a metal complex with iridium as a main metal (hereinafter referred to as "an iridium complex") is used. Thus, it can be said that a characteristic is to introduce a third transition series element as a main metal in any metal complex. Of those, there is a metal complex in which the theoretical limitation value of the external quantum efficiency as described above greatly exceeds 5%.

As described in References 2 and 3, with respect to the organic EL element capable of converting the triplet excitation energy into light to be emitted, higher external quantum efficiency than a conventional element can be achieved. In addition, if the external quantum efficiency is increased, a light emission intensity is improved. Thus, it is considered that the organic EL element capable of converting the triplet excitation energy into light to be emitted constitutes a large share toward future developments as a manner for achieving high intensity light emission and high light emission efficiency.

However, since both platinum and iridium are so-called noble metal, the platinum complex and the iridium complex using these metals are expensive and thus it is expected that a cost reduction is hindered in future. In addition, when the influence of a metal complex including heavy metal on the human body is considered, a material, which is safe and for which waste processing is easily performed is desirable.

Therefore, it is desirable that the organic EL element capable of converting the triplet excitation energy into light to be emitted (that is, light is emitted as phosphorescence), without using the iridium complex and the platinum complex, which are already existed, is developed. A most simple method is for developing a new organic compound in which light is emitted as phosphorescence at a room temperature with a low cost. However, a clear molecular design plan is not established until now and it is very difficult in many sides.

Thus, although it is important to develop new phosphorescence light emission material, it is the situation that a method of designing an element structure such that phosphorescence light emission is promoted with respect to an organic EL material is desirable.

Also, with respect to the organic EL elements capable of converting the triplet excitation energy into light to be emitted, as described in References 2 and 3, there is a problem in an element life, that is., the half life of intensity does not reach a practicable level. According to the report example of Reference 3, when an initial intensity is set to be 500 cd/m², the half time of the intensity is about 170 hours.

Even if the high intensity light emission and the high light emission efficiency are achieved, the element life is very important for practicable use. Thus, it is said that an element structure effective to stabilization of an element is desirable if possible.

SUMMARY OF THE INVENTION

Therefore, an object of the present invention is to achieve an organic EL element capable of converting triplet excitation energy into light to be emitted by using a conventional organic compound and devising an element structure. Also, another object of the present invention is to provide an organic EL element in which light emission efficiency is high, can be manufactured using a conventional organic compound with a low cost, and can be operated as stable as possible.

Also, an object of the present invention is to provide a light emitting device with a low cost, which is bright and has low consumption power, using an organic EL element disclosed by the present invention. Further, an object of the present invention is to provide electric equipment, which is bright, has low consumption power, and is low in costs, using such a light emitting device.

The present inventor focused attention on a heavy atom effect, which is known in the field of photo luminescence (hereinafter referred to as "PL"). The heavy atom effect is a phenomenon in which a heavy atom is introduced into a molecular of a luminescent substance or a heavy atom is made present in an ambiance such as a solvent into which a luminescent substance is dissolved and spin-orbit interaction is thus increased and intersystem crossing (S* T*) or phosphorescence light emission (T* So) as a forbidden transition is promoted. Note that the heavy atom indicates an atom having a large number of atomic nucleus loads (corresponding to atomic number, that is, the number of positive electric charges in atomic nucleus).

The heavy atom effect includes two types, that is, an internal-heavy atom effect and an external heavy atom effect. The internal heavy atom effect is that phosphorescence light emission is promoted in the case where a heavy atom is included in a molecular of a luminescent substance. It is said that the iridium complex and the platinum complex are an example utilizing this internal heavy atom effect. On the other hand, even when a heavy atom is present in a solvent into which a luminescent substance is dissolved, there is a case where the promotion of phosphorescence light emission of a luminescent substance is observed. This phenomenon is called the external heavy atom effect.

The present inventor devised a method of producing this external heavy atom effect in an organic EL element. That is, this is a method of locating a material including a heavy atom near a light emitting portion to promote the phosphorescence light emission.

It is considered that an element obtained by the method of simply dispersing a material including a heavy atom into an organic compound layer is hard to function as the organic EL element. For example, when alkali metal (such as cesium) of metals is doped into the organic compound layer, the electrical conductivity of the doped layer is improved and thus the layer can exert a superior function as a carrier transport layer.

However, since the doped metal becomes a material for deactivating excitation energy to suppress light emission (hereinafter referred to as "a quencher"), the layer into which the metal is doped as described above does not emit light. Therefore, it is generally difficult to use this layer as a luminescent layer.

In order to solve such a problem, the present invention is characterized in that a material of an organic compound layer (hereinafter referred to as "an organic EL material") is impregnated into or made in contact with a porous body of metal oxide. Although there are various metal oxides, it is considered that the metal oxide is an insulator in many cases in view of physical property and generally hard to become a quencher. Also, it is considered that a porous body is used without using a dense material and the organic EL material (particularly a portion as a luminescent layer) is made present in the porous body and thus the external heavy atom effect can be produced.

Here, it is considered that a method of forming a metal oxide porous body includes three methods.

According to a first method, in a process for manufacturing the organic EL element, a metal as an electrode (anode or cathode) is formed and then anodization processing is performed for its surface to make an electrode surface a metal oxide porous body. Thus, the present invention is characterized by a light emitting device using an organic EL element including an anode layer, a cathode layer, and an organic compound layer provided between the anode layer and the cathode layer, in which at least one of the anode layer and the cathode layer has an oxide film formed by anodization processing and the oxide film is in contact with the organic compound layer.

According to a second method, an electrode is formed as in the first method and then a metal oxide porous body including the same kind of metal element as an electrode material is formed thereon using a sol-gel method. Thus, the present invention is characterized by a light emitting device using an organic EL element including an anode layer, a cathode layer, and an organic compound layer provided between the anode layer and the cathode layer, in which a metal oxide layer formed by a sol-gel method is provided between at least one of the anode layer and the cathode layer and the organic compound layer.

According to a third method, a porous body such as zeolite is used. Thus, the present invention is characterized by a light emitting device using an organic EL element including an anode layer, a cathode layer, and an organic compound layer provided between the anode layer and the cathode layer, in which the organic compound layer contains zeolite or is in contact with the zeolite.

Note that, it is considered that most of metal atoms can produce the heavy atom effect in different degrees. In the field of PL, the heavy atom effect is clearly produced in the case where the metal oxide porous body particularly includes an atom having a weight equal to or larger than bromine (Br; atomic number is 35). Therefore, in any method, a metal element having a larger atomic number than rubidium (Rb; atomic number is 37) is preferable as a metal element included in the metal oxide porous body.

Also, among the above three methods, in particular, when the anodization processing or the sol-gel method is used, the metal oxide porous body is formed as a film on the electrode and formed continuously (slantly) to the electrode material. In the case of such a structure, it is expected that an electric field having higher uniformity can be applied as compared with an element having an electrode in which irregular unevenness with some degree is generally present.

Thus, since local concentration of an electric field can be prevented, it is considered that dielectric breakdown, deterioration of a material, and the like are suppressed. Therefore, there is a possibility that an element structure disclosed by the present invention leads a long life of an element. It is said that an effect in which an improvement of driver stability of the element may be expected is one of important characteristics of the present invention.

From the above reason, when the present invention is embodied, it is possible to provide an organic EL element in which light emission efficiency is high, can be manufactured using a conventional organic compound with low costs, and can be operated as stable as possible.

DETAILED DESCRIPTION OF THE PREFERRED EMBODIMENTS

First, a method using anodization processing will be described. The anodization is a method of applying a voltage using a metal as an anode in a suitable electrolyte to form an oxide film on a metal surface. A thickness of the oxide film is given by the following equation, $$d = M/(zF\bar{n}) \cdot I \cdot t \quad (1),$$

where d denotes a thickness of the oxide film, M denotes a molecular weight of the oxide film, z denotes a total valence of metal in the oxide film (for example, in the case of $Al_2O_3$, trivalence×2=hexavalence), F denotes Faraday constant, $\bar{n}$ denotes a density, I denotes a current density, and t denotes time.

When the equation (1) is viewed, since F is a constant and M, z, and $\bar{n}$ are values inherent in a substance, a thickness of the oxide film is determined based on transmission electrical quantity and time. Thus, when a voltage and a voltage applying time are suitably set, the oxide film can be formed with high reproducibility. Note that a structure of the oxide film is changed dependent on a kind of electrolyte to be used. Thus, the attention is required.

When a neutral solution such as borate or tartrate is used as an electrolyte, a barrier oxide film, that is, an oxide film, which is not a porous body, is produced. At this point, the oxide film grows without dissolving. Then, a resistance is increased as the oxide film grows. Thus, when a constant voltage is applied thereto, a current does not gradually flow and the growth of the oxide film is almost saturated. Therefore, the thickness of the oxide film is determined based on an initial voltage. That is, the oxide film is produced as a function of a voltage to be applied.

Note that, since the barrier oxide film is relatively dense in this case, it is inadequate for the case where an organic EL material is impregnated into the metal oxide porous body.

Figure 1A:
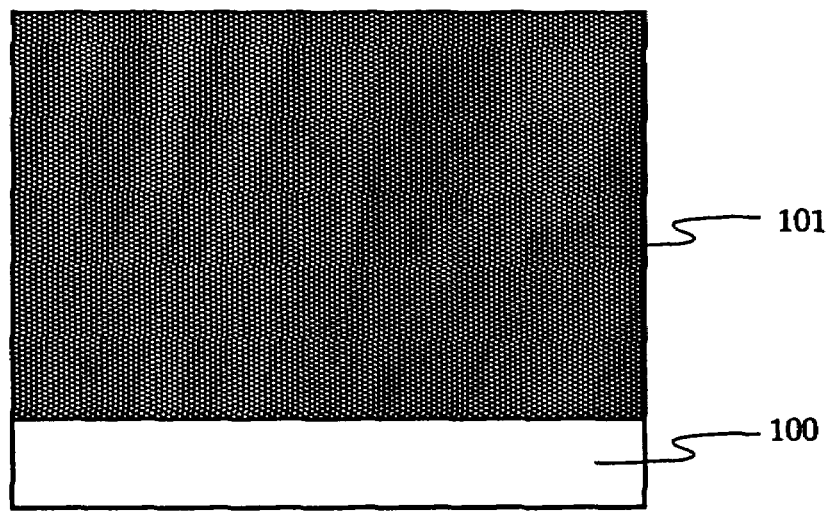
FIGS. 1A and 1B show a porous oxide film by anodization.
Figure 1B:
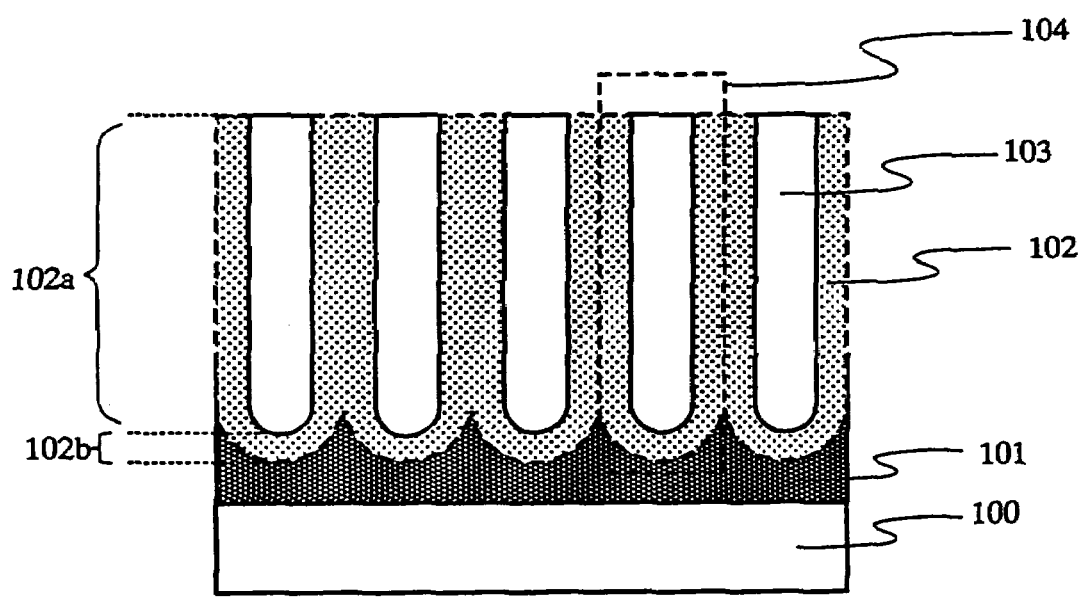

However, when anodization processing is performed for a metal film 101 formed on a substrate 100 as shown in FIG. 1A in a weak acid solution having suitable dissolving power, such as sulfuric acid, phosphoric acid, oxalic acid, chromic acid, a porous oxide film having a structure as shown in FIG. 1B is produced. An oxide film 102 is an aggregate of cells 104 having pores 103 vertical to the metal film 101 and made from a porous layer 102a and a semicircular barrier layer 102b which is present in bottom portions of the pores 103.

Here, when the anodization is performed with a constant voltage, a voltage is applied to the barrier layer 102b. Thus, the oxide film is produced and simultaneously dissolved in the barrier layer 102b. In this case, while the thickness of the barrier layer 102b is kept constant, it progresses in a thickness direction of the oxide film with the lapse of the voltage applying time. That is, the thickness of the porous layer 102a is increased with the lapse of the voltage applying time (dissolving progresses).

That is, the thickness of the barrier layer 102b can be determined based on an applying voltage and the thickness of the porous layer 102a is determined based on the voltage applying time. The thickness of the barrier layer 102b can be controlled with about several angstroms. The thickness of the porous layer 102a can be controlled with about several tens of nm.

In the case where this oxide film is applied to the organic EL element, if the thickness of the barrier layer 102b exceeds several nm or the thickness of the porous layer 102a exceeds the thickness (100 to 200 nm) of the organic compound layer, there is a possibility that a driver voltage of the element is increased. However, with respect to the porous oxide film produced by the anodization, these problems are solved. Thus, it is said that such an oxide film is suitable for the present invention.

In order to improve injection efficiency of a hole, a metal having a large work function is used as the anode layer of the organic EL element. As a metal group in which a work function is large and anodization processing is relatively easy, metals of groups 4 to 6 of the periodic table are considered. In particular, titanium, tantalum, and tungsten are suitable because of high film formability and a large work function.

On the other hand, in order to improve injection efficiency of an electron, a metal having a small work function is used as the cathode layer of the organic EL element. In this case, after the cathode layer is formed, anodization processing is performed to form the organic compound layer. That is, this order is an element manufacturing process for manufacturing the element from the cathode layer side. Such a case is also included in the present invention.

Next, a method using a sol-gel method will be described. The sol-gel method is a kind of liquid phase reaction and utilizes a reaction in which a polymer particle obtained by polymerizing a molecular with a polymerization reaction in a solution is set from a sol to a gel. In particular, this method is used for forming the metal oxide and can be used for forming the porous body. A sol can be easily used for forming a thin film by a known method such as spin coating or dip coating. Thus, in this aspect, the sol-gel method is suitable for the present invention.

According to the sol-gel method, metal alkoxide $M(OR)_x$ (M denotes metal, OR denotes alkoxy group, and x denotes the same integer as valence of M) is generally used as a raw. A method of making the metal alkoxide a stable sol by hydrolysis or the like, then coating it on a substrate, drying, and firing is a fundamental process.

For example, in the case where $SiO_2$ is formed by the sol-gel method using alkoxysilane $Si(OR)_4$, when $Si(OR)_4$ is hydrolyzed with a weak acid solution, the following reaction is produced. A stable sol is formed in an oligomer which is produced by this reaction and which has a small amount of hydroxyl.

Formula 1

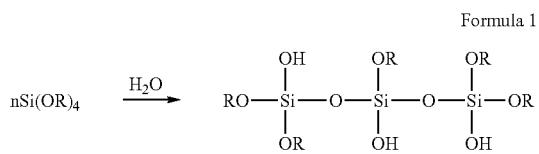

This sol is formed on a substrate using a spin coating method or the like and drying and firing are repeated. Thus, an $SiO_2$ thin film is obtained. Also, in the case of another metal oxide formation method, this can be basically achieved by the sol-gel method based on metal alkoxide as the above.

This method is sufficiently effective for the present invention. However, there is one problem. That is with respect to control of a film thickness. The thickness of organic compound layer is an order of 100 to 200 nm and the thickness of the luminescent layer is an order of several tens of nm. In this case, when only coating of the sol is simply performed, it is said that a film thickness control with those levels is somewhat difficult. Note that, if a suitable condition such as the number of revolutions and a concentration is found, the control is allowed.

Therefore, in the present invention, it is further preferable that a surface sol-gel method is used. The surface sol-gel method is for growing an inorganic thin film based on a dehydration polymerization reaction between substances. The description of that process is shown in FIGS. 2A to 2C.

Figure 2A:
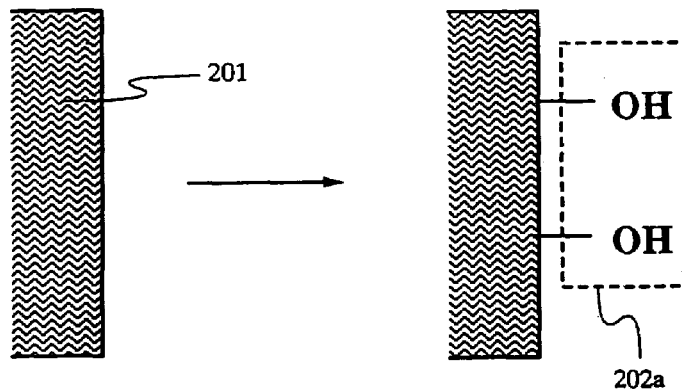
FIGS. 2A to 2C show a mechanism of a surface sol-gel method.
Figure 2B:
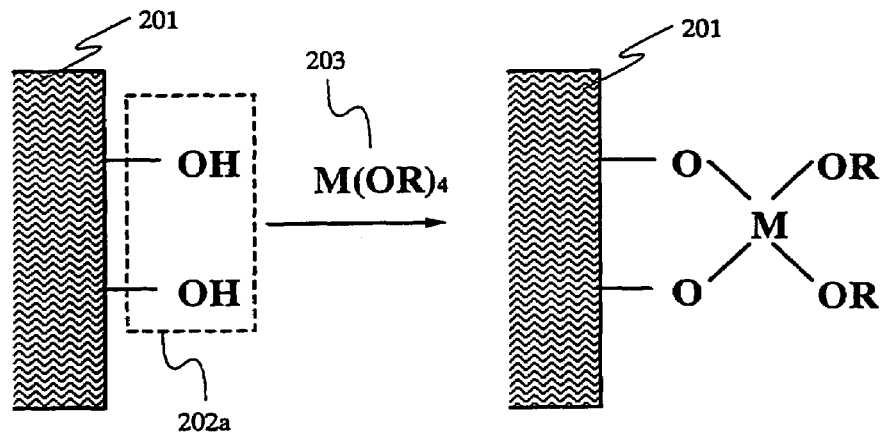
Figure 2C:
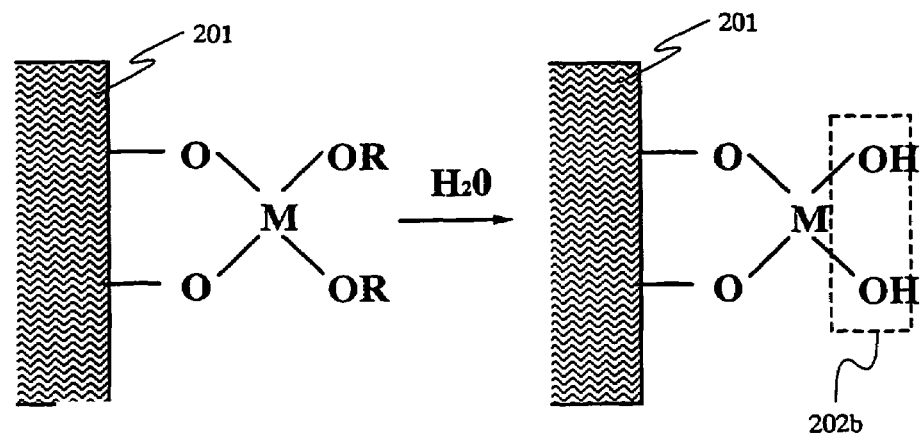

First, hydrophilic processing is performed for the surface of a metal 201 to provide hydroxyls 202a (FIG. 2A). Next, metal alkoxide 203 (M denotes a metal) including the same kind of metal element as the metal 201 is chemically absorbed onto the metal having the hydroxyls (FIG. 2B). Finally, the surface onto which the metal alkoxide 203 is chemically absorbed is hydrolyzed to again provide hydroxyls 202b on the surface (FIG. 2C). Further, when the operations of from FIG. 2B to FIG. 2C are repeated, an arbitrary film thickness is obtained. Since a film thickness obtained in one cycle is several nm, it is said that such a method is suitable for the present invention.

In addition, there is a preferable film forming method except for the surface sol-gel method mentioned above. For example, metal alkoxide and a constitutional material of the organic compound layer are dissolved into the same solvent, then a hydrolysis and a heat treating is performed after coating this solution on the electrode. Thus, a structure in which the constitutional material of the organic compound layer is contained in the metal oxide porous body can easily be formed.

In a method mention above, there is an advantage that the organic compound layer (or a part of the organic compound layer) and the metal oxide porous body can be formed at the same time. Further, because the solution comprising the metal alkoxide and the material of the organic compound layer is coated on electrode, control of the film thickness is relatively easy.

In order to improve injection efficiency of a hole, it is considered that metal having a large work function (groups 4 to 6 of the periodic table) is effective as the anode layer of the organic EL element. According to an embodiment of the present invention, the metal oxide porous body including the same kind of metal element as the electrode material is formed using the sol-gel method. Thus, when the metal oxide porous body is provided between the anode layer and the organic compound layer, the metal element included in the metal oxide porous body is preferably a metal of groups 4 to 6 of the periodic table. In particular, titanium, tantalum, and tungsten are suitable because of high film formability and a large work function.

On the other hand, in order to improve injection efficiency of an electron, metal having a small work function is used as the cathode layer of the organic EL element. In this case, the cathode layer is formed, the metal oxide porous body having the same kind of metal element as the cathode layer is formed by the sol-gel method, and then the organic compound layer is formed. That is, this order is an element manufacturing process for manufacturing the element from the cathode layer side. Such a case is also included in the present invention.

Finally, a method using zeolite will be described. The zeolite is composed of skeletons of silica and alumina and thus has atoms of silicon and aluminum. However, in addition to these atoms, the zeolite generally includes atoms of alkali metal, alkali earth metal, and the like. In some cases, the zeolite also includes a metal atom such as thallium or silver. Hereinafter, such metal is simply referred to as a "cation metal". Since this cation metal can be substituted, when a heavy atom is introduced into a cation metal site, the heavy atom effect can be expected.

As a method of obtaining an element structure using the zeolite, two kinds of methods are broadly considered. One is a method of preparing a superfine powder (~1 μm) of the zeolite and dispersing it into a material composing the organic compound layer.

However, since a thickness of the organic compound layer is generally 100 nm to 200 nm, it is somewhat difficult to obtain a zeolite fine powder having a particle size equal to or smaller than this thickness. Thus, in this case, a thickness of the organic compound layer is desirably set to be equal to or larger than a particle size of the zeolite (1 μm or larger).

When a thickness of the organic compound layer is set to be about 1 μm, it is expected that a driver voltage becomes higher. As a method of preventing this, there is doping to a charge transport layer. When doping is performed for the charge transport layer (Lewis base to an electron transport layer and Lewis acid to a hole transport layer), electric conductivity is improved to a degree equal to that of semiconductor. Thus, even if the entire thickness of the organic compound layer becomes about 1 μm, there is no case where the driver voltage becomes higher.

Figure 3A:
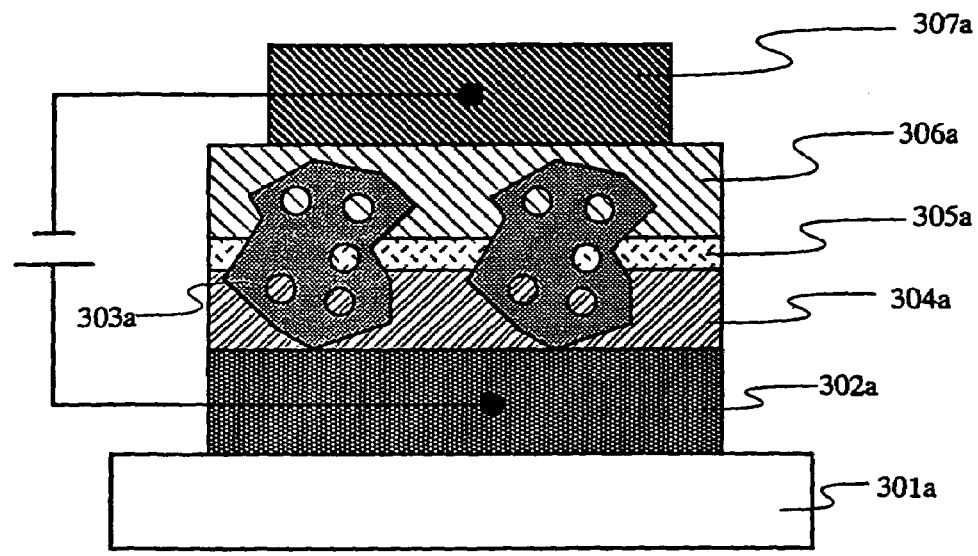
FIGS. 3A and 3B show an organic EL element using zeolite.

FIG. 3A shows an example in which a doped hole transport layer 304a, a luminescent layer 305a, a doped electron transport layer 306a, and a cathode layer 307a are laminated on a substrate 301a into which zeolite fine powders 303a are dispersed and an anode layer 302a. In order to prevent desorption of the zeolite, dip coating is preferable. In this case, when it is designed such that a relationship "(film thickness of the hole transport layer)<(particle size of the zeolite)<(total film thickness of the hole transport layer, the luminescent layer, and the electron transport layer)" is satisfied, the luminescent layer is contained in the zeolite and the thickness of the organic compound layer exceeds the particle size of the zeolite.

Another method of obtaining an element structure using the zeolite is to make thin film formation. As a well known zeolite synthesizing method, there is a method of mixing aluminate and silicate of the cation metal and heating them at about 100° C. to 200° C.

Figure 3B:
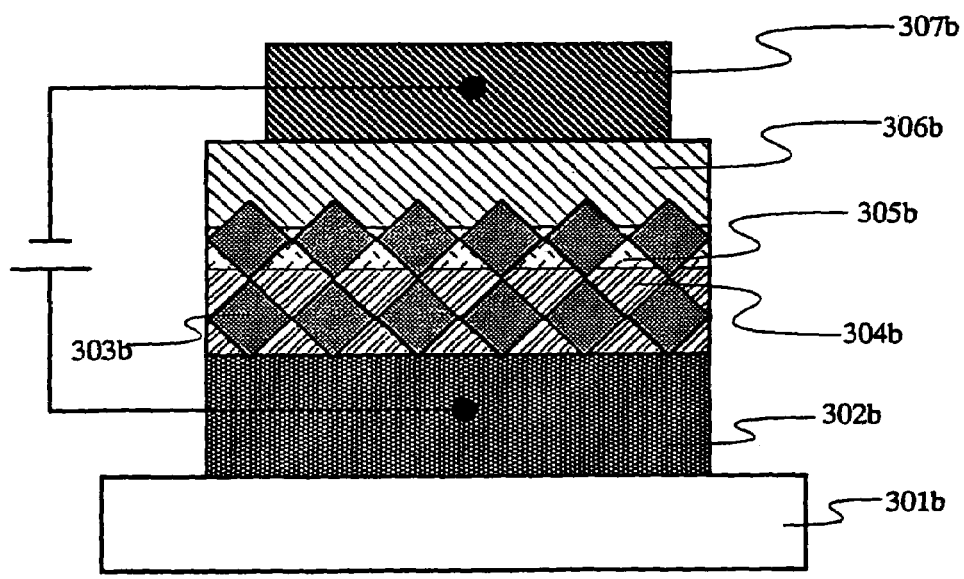

Thus, preferably, a zeolite film is produced in advance on a substrate having an electrode by the above method and then the organic compound layer is formed. An example in which such an element is formed on a substrate 301*b* having an anode layer 302*b* is shown in FIG. 3B. When the thickness of a zeolite film 303*b* cannot be formed thinner than a thickness of a general organic compound layer (100 to 200 nm), as in the case of FIG. 3A, a structure in which a luminescent layer 305*b*, a doped electron transport layer 306*b*, and a cathode layer 307*b* are laminated on a doped hole transport layer 304*b* is preferable.

Note that, a particle size of the zeolite fine particle or a film thickness of the zeolite film can be controlled to about 100 to 200 nm, it is unnecessary to use the charge transport layer doped as the above and thus an organic compound layer having a general film thickness (100 to 200 nm) is preferably formed.

Although the cation metal of the zeolite can be substituted as described above, generally, it is easy to apply alkali metal and alkali earth metal. In particular, when rubidium, strontium, cesium, or barium is used as the cation metal, it is preferable in view of the heavy atom effect.

Also, although an order for forming a film from the anode layer side in succession is described here, a method of firstly forming the cathode layer and then forming the organic compound layer and the anode layer in succession may be used.

Embodiment 1

Figure 4:
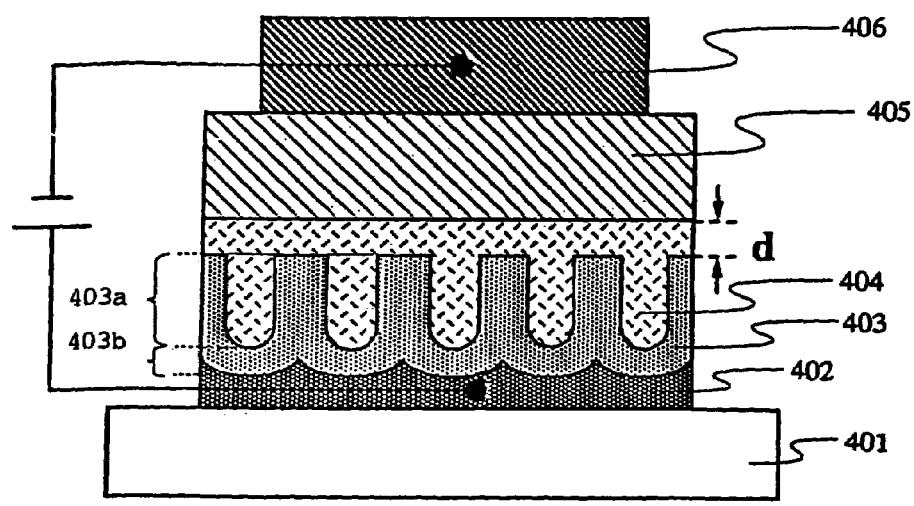
FIG. 4 shows the structure of an organic EL element.

In this embodiment, an element in which a porous oxide film is formed using anodization, as shown in FIGS. 1A and 1B will be described with a concrete example. A method in which a pixel electrode is formed using tantalum (Ta), an anodization is performed using Ta as the anode, and a film is formed from the anode side will be described with an example. An element structure is shown in FIG. 4.

First, Ta is formed as an anode layer 402 on a glass substrate 401 by sputtering. At this point, it is required that a Ta film to be formed has a sufficient thickness (~1 µm). This is because the film surface becomes an oxide film by anodization processing as described later.

Next, anodization processing is performed using the formed Ta film as an anode in an oxalic acid solution to form an oxide film 403. The oxide film 403 is composed of a porous layer 403*a* having pores vertical to the film surface and a barrier layer 403*b* in which the number of holes is relatively small. The thickness of the porous layer 403*a* is controlled based on a voltage applying time and the thickness of the barrier layer 403*b* is controlled based on an applying voltage. It is desirable that the thickness of the porous layer 403*a* is about 50 to 60 nm and the thickness of the barrier layer 403*b* is about 1 to 2 nm. Also, it is required that the thickness of the barrier layer 403*b* is suppressed to be several nm or thinner at maximum.

When the organic compound layer is formed, a polyparaphenylenevinylene derivative which is indicated-by the following chemical formula (2) (hereinafter referred to as "a PPV derivative") is used as a luminescent layer 404 and bathocuproine which is indicated by the following chemical formula (3) (hereinafter referred to as "BCP") is used as an electron transport layer 405.

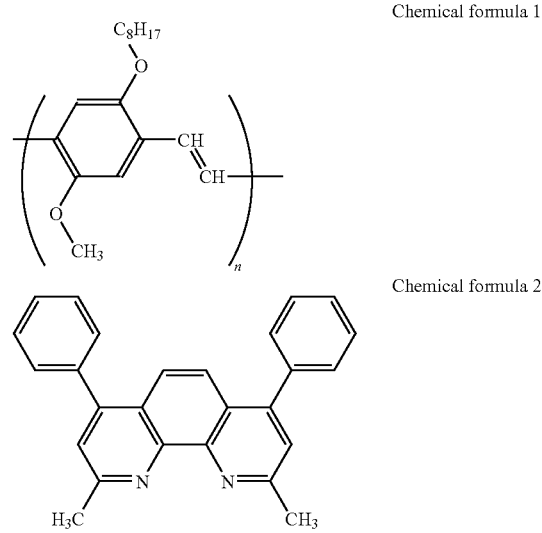

Chemical formula 1

Chemical formula 2

The luminescent layer 404 is formed by spin coating or dip coating using a PPV derivative solution in which the PPV derivative is dissolved into toluene. After coating, thermal treatment is performed at 80° C. to remove the toluene as a solvent.

In the case of this embodiment, when the formation of the electron transport layer 405 is considered, it is required that the thickness of the luminescent layer 404 exceeds that of the porous layer 403*a*. That is, in order to make a contact between the luminescent layer 404 and the electron transport layer 405 in the entire film surface, a thickness d in FIG. 4 is required. Precision control of the-thickness d in FIG. 4 is difficult. However, when the concentration of a solution and the number of revolution for spin coating are controlled, the control of the thickness of about 10 to 20 nm can be sufficiently made. If a sufficient film thickness is not obtained by coating once, the coating may be performed several times.

After the formation of the luminescent layer 404, the electron transport layer 405 is formed. In this embodiment, BCP is vacuum-evaporated to form the electron transport layer 405. The film thickness is set to be 30 nm.

Finally, an Al:Li alloy (Li: 5 wt %) is formed as a cathode layer 406 by vacuum evaporation. In the case of this embodiment, the cathode layer 406 becomes a light pickup surface. Thus, it is necessary to form the cathode layer 406 as a super thin film having a thickness about 20 nm. In addition, in a case that the anode layer 402 becomes a light pickup surface, it is necessary to form the anode layer 402 as a super thin film having a thickness about 20 nm.

Embodiment 2

Figure 5:
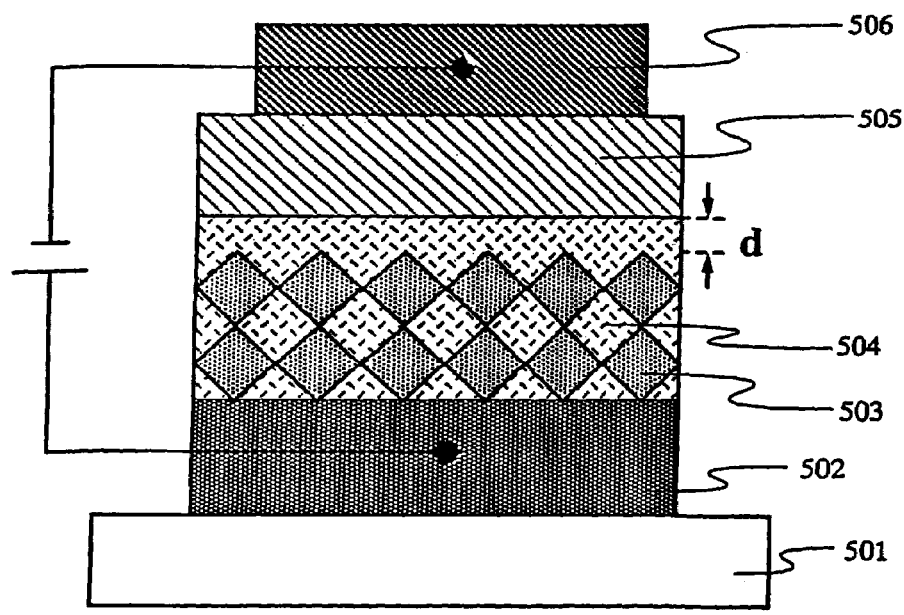
FIG. 5 shows the structure of an organic EL element.

In this embodiment, an element in which a metal oxide porous body is formed using a sol-gel method, as shown in FIGS. 2A to 2C will be described with a concrete example. In a case of sol-gel method, the pixel electrode is formed using Ta or indium tin oxide (ITO) since the metal oxide porous is formed besides the electrode. A method of forming a film from an anode layer side using tantalum (Ta) as the anode layer will be described with an example. An element structure is shown in FIG. 5.

First, Ta is formed as an anode layer 502 on a glass substrate 501 by sputtering. A Ta film formed in this embodiment preferably has a thickness such as it sufficiently functions as an electrode (concretely, about 100 nm).

Next, an oxide porous layer 503 ($Ta_2O_5$ in this embodiment) is formed on the anode layer 502 by a surface sol-gel method. Penta-n-propoxytantalum ($Ta(O-n-C_3H_7)_5$; liquid in a room temperature)) is used as a raw. First, the anode layer 502 for which hydrophilic processing is performed in advance is immersed into a toluene/ethanol solution of penta-n-propoxytantalum for 3 minutes. After that, a rinse is performed with an ethanol solution and then hydrolysis using pure water is made to provide hydroxyl on the surface of metal alkoxide.

With respect to the formation of the oxide porous layer 503, the above steps are set as one cycle. If a thicker film thickness is obtained, this cycle is preferably repeated. Finally, drying and thermal treatment are performed to remove pure water, and thus the oxide (oxide tantalum in this embodiment) porous layer 503 is obtained. In this embodiment, it is desirable that the film thickness finally becomes about 50 to 60 nm.

Further, when the organic compound layer is formed, the PPV derivative indicated by the chemical formula (2) is used as a luminescent layer 504 and the BCP indicated by the chemical formula (3) is used as an electron transport layer 505.

The luminescent layer 504 is formed by spin coating or dip coating using a PPV derivative solution in which the PPV derivative is dissolved into toluene. After coating, thermal treatment is performed at 80° C. to remove the toluene as a solvent, and thus the luminescent layer 504 is obtained.

In the case of this embodiment, when the formation of the electron transport layer 505 is considered, it is required that the thickness of the luminescent layer 504 exceeds that of the oxide porous layer 503. That is, in order to make a contact between the luminescent layer 504 and the electron transport layer 505 in the entire film surface, a thickness d in FIG. 5 is required. Precision control of the thickness d in FIG. 5 is difficult. However, when the concentration of a solution and the number of revolution for spin coating are controlled, the control of the thickness of about 10 to 20 rum can be sufficiently made. If a sufficient film thickness is not obtained by coating once, the coating may be performed several times.

After the formation of the luminescent layer 504, the electron transport layer 505 is formed. In this embodiment, BCP is vacuum-evaporated to form the electron transport layer 505. After the coating, thermal treatment is performed to remove moisture. The film thickness is set to be 30 nm.

Finally, an Al:Li alloy (Li: 5 wt %) is formed as a cathode layer 506 by evaporation. In the case of this embodiment, the cathode layer 506 becomes a light pickup surface. Thus, it is necessary to form the cathode layer 506 as a super thin film having a thickness about 20 nm. An example in which the metal oxide porous body is formed is showed in Embodiment 1 and 2. However, a thin film of metal oxide can be formed. In case of the thin film, it is necessary to control a film thickness 5 nm or less.

Embodiment 3

Figure 6:
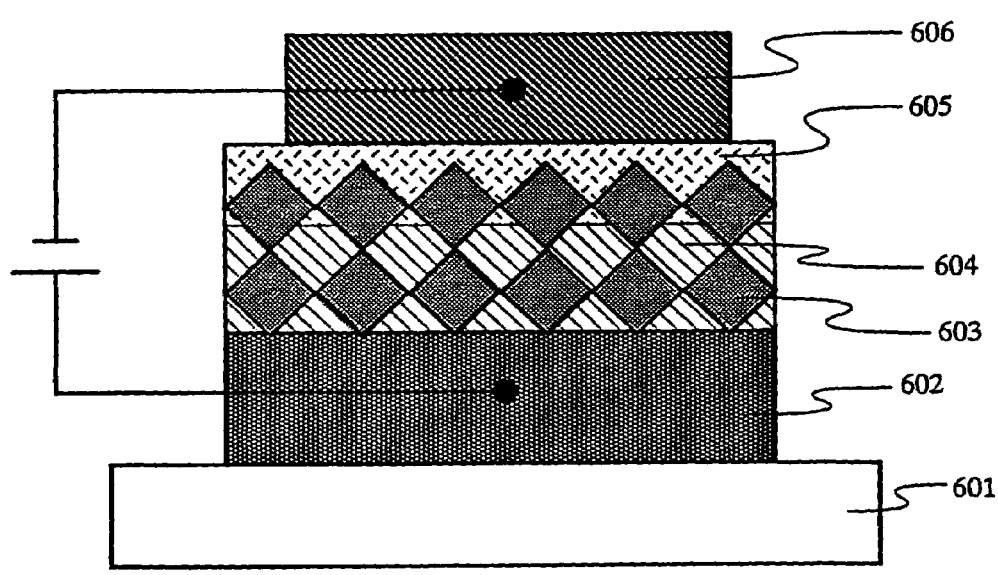
FIG. 6 shows the structure of an organic EL element.

In this embodiment, an element into which zeolite is introduced as a metal oxide porous body, as shown in FIGS. 3A and 3B will be described with a concrete example. In case of introducing zeolite, the metal oxide porous body is formed besides the electrode. An organic EL element manufacturing method of forming a film from the side of a transparent electrode (an anode layer), which is a pixel electrode, will be described with an example. An element structure is shown in FIG. 6.

First, the indium tin oxide (ITO) which is a transparent electrode is formed as an anode layer 602 on a glass substrate 601 by sputtering and then coated with an aqueous solution of sodium silicate and sodium aluminate. Then, thermal treatment is performed at 100° C. for 6 hours to form zeolite X (cation metal is sodium) (a zeolite film 603).

Next, when the promotion of phosphorescence by the heavy atom effect is considered, the cation metal of the zeolite X is transformed from sodium to cesium. This cation transform can be made by immersing a substrate in which the zeolite X is formed into an aqueous solution of cesium nitrate (10% in concentration) at 90° C. It is necessary to repeat this immersion operation several times.

As described above, after a cesium atom is introduced into the zeolite, an organic compound layer is formed. First, a film as a hole injection layer 604 is formed by spin coating using an aqueous solution in which polyethylene dioxythiophene (hereinafter referred to as "PEDOT") indicated by the following chemical formula (4) is mixed with polystyrene sulfonic acid (hereinafter referred to as "PSS") (hereinafter this solution is referred to as "PEDOT/PSS"). After the film formation, heating is performed to remove moisture and thus the hole injection layer 604 is obtained. Since it is required that the hole injection layer 604 has a film thickness close to that of the zeolite film (~several hundreds of nm), the spin coating is desirably performed several times. In this case, the spin coating is not continuously performed and it is required that thermal treatment is performed every spin coating to remove moisture (because the elution of a film which has already been formed is prevented).

Chemical formula 3

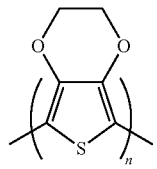

Next, a film is formed by spin coating using a toluene solution of the PPV derivative indicated by the chemical formula (2) and then a solvent is removed to obtain a luminescent layer 605. In this embodiment, an electron transport layer is not used. Thus, the film formation in which the film thickness exceeds that of the zeolite film at this time is required. The film thickness of the luminescent layer 605 is desirably controlled to be 100 nm to 200 nm.

A cathode layer 606 is formed on the organic compound layer formed as the above. A metal having a small work function is applied to the cathode layer 606 and generally, alkali metal and alkali earth metal or an alloy including these metals are applied thereto. In addition, rare earth metal such as ytterbium can be used as the cathode layer 606. The film formation method is generally vacuum evaporation. In this embodiment, ytterbium is formed at 400 nm by vacuum evaporation.

Embodiment 4

Figure 7:
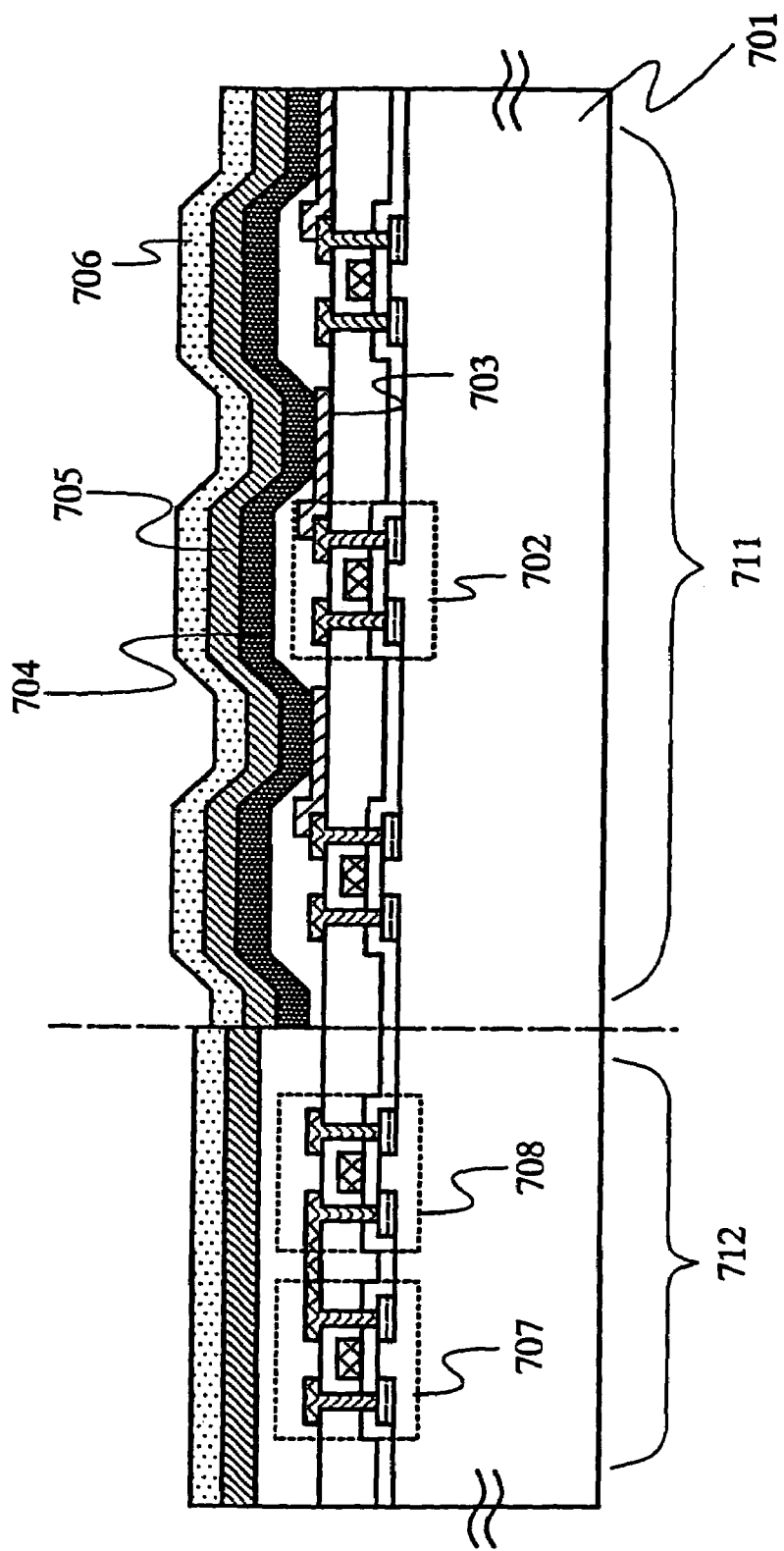
FIG. 7 shows a cross sectional structure of a light emitting device.

In this embodiment, a light emitting device including an organic EL element disclosed by the present invention will be described. FIG. 7 is a cross sectional view of an active matrix light emitting device using an organic EL element of the present invention. Note that although a thin film transistor (hereinafter referred to as "a TFT") is used here as an active element, an MOS transistor may be used.

Also, a top gate TFT (concretely, a planer TFT) is shown as the TFT. However, a bottom gate TFT (typically, an inverse staggered TFT) can be used.

In FIG. 7, reference numeral 701 denotes a substrate. A substrate which transmits visual light is used here. Concretely, a glass substrate, a quartz substrate, a crystallized glass substrate, or a plastic substrate (including a plastic film) is preferably used. Note that the substrate 701 includes an insulating film provided on the substrate surface.

A pixel portion 711 and a driver circuit 712 are provided on the substrate 701. First, the pixel portion 711 will be described.

The pixel portion 711 is a region for image display and has a plurality of pixels. A TFT (hereinafter referred to as "a current control TFT") 702 for controlling a current flowing into an organic EL element, a pixel electrode (anode layer) 703, an organic compound layer 704, and a cathode layer 705 are provided in the respective pixels. Note that, although only the current control TFT is shown in FIG. 7, a TFT (hereinafter referred to as "a switching TFT") for controlling a voltage applied to the gate of the current control TFT is also provided.

Here, a p-channel TFT is preferably used as the current control TFT 702. Although an n-channel TFT can be used, when the p-channel TFT is used in the case where the current control TFT is connected with the anode of the organic EL element as shown in FIG. 7, consumption power can be further suppressed. Note that either an n-channel TFT or a p-channel TFT may be used as the switching TFT.

Also, the pixel electrode 703 is electrically connected with the drain of the current control TFT 702. In this embodiment, a conductive material having a work function of 4.5 to 5.5 eV is used as a material of the pixel electrode 703. Thus, the pixel electrode 703 functions as the anode of the organic EL element. As the pixel electrode 703, typically, indium oxide, tin oxide, zinc oxide, or a compound of these (ITO or the like) is preferably used. The organic compound layer 704 is provided on the pixel electrode 703. Note that although not shown, a thin film of the metal oxide porous body as described in Embodiments 1 to 3 is provided between the pixel electrode and the organic compound layer.

Further, the cathode layer 705 is provided on the organic compound layer 704. A conductive material having a work function of 2.5 to 3.5 eV is used as a material of the cathode layer 705. As the cathode layer 705, typically, a conductive film including an alkali metal element or an alkali earth metal element or a laminate of that conductive film and an aluminum alloy formed thereon is preferably used.

A layer composed of the pixel electrode 703, the organic compound layer 704, and the cathode layer 705 is covered with a protective film 706. The protective film 706 is provided to protect the organic EL element from oxygen and water. As a material of the protective film 706, silicon nitride, silicon oxynitride, aluminum oxide, tantalum oxide, or carbon (concretely, diamond-like carbon) is used.

Next, the driver circuit 712 will be described. The driver circuit 712 is a region for controlling the timing of signals (gate signal and data signal) transmitted to the pixel portion 711 and a shift register, a buffer, a latch, an analog switch (transfer gate) or a level shifter is provided therein. In FIG. 7, a CMOS circuit composed of an n-channel TFT 707 and a p-channel TFT 708 is shown as a basic unit of these circuits.

Note that a known structure may be used as a circuit structure of the shift register, the buffer, the latch, the analog switch (transfer gate) or the level shifter. Also, in FIG. 7, the pixel portion 711 and the driver circuit 712 are provided on the same substrate. However, an IC or a LSI can be electrically connected with the pixel portion 711 without providing the driver circuit 712.

Also, in FIG. 7, the pixel electrode (anode layer) 703 is electrically connected with the current control TFT 702. However, a structure in that the cathode layer is connected with the current control TFT can be used. In this case, the pixel electrode is preferably formed with the same material as the cathode layer 705 and the cathode layer is preferably formed with the same material as the pixel electrode (anode layer) 703. In this case, an n-channel TFT is preferably used as the current control TFT.

Figure 8A:
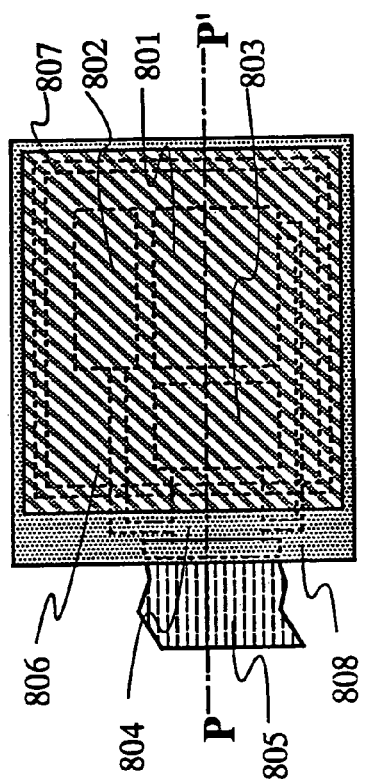
FIGS. 8A and 8B show a top structure and a cross sectional structure of the light emitting device.
Figure 8B:
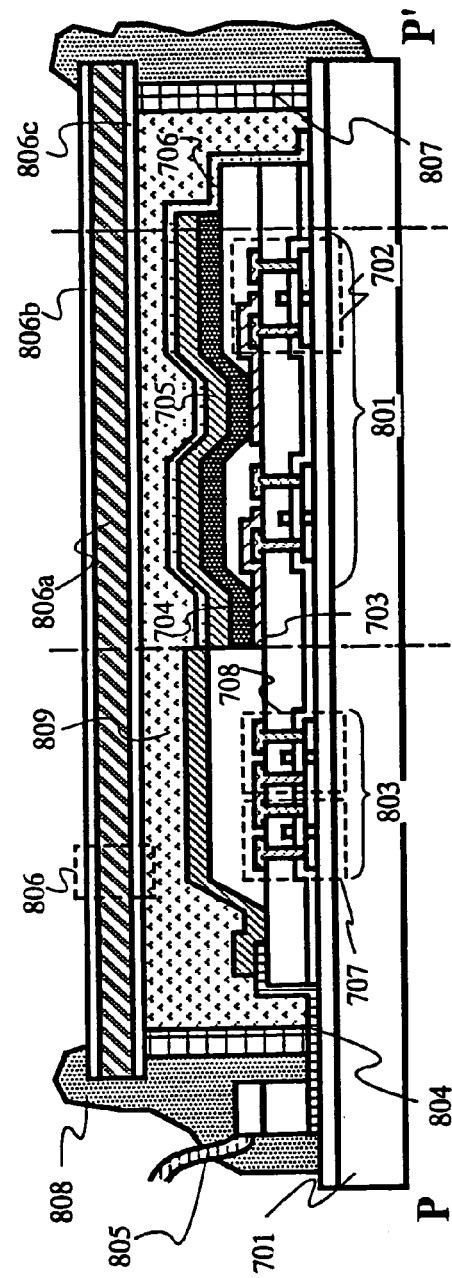

Here, an appearance of the active matrix light emitting device shown in FIG. 7 is shown in FIGS. 8A and 8B. Note that FIG. 8A is a top view and FIG. 8B is a cross sectional view obtained by cutting FIG. 8A along a dashed line P-P'. In addition, symbols in FIG. 7 are referred to.

In FIG. 8A, reference numeral 801 denotes a pixel portion, 802 denotes a gate signal side driver circuit, and 803 denotes a data signal side driver circuit. Also, signals transmitted to the gate signal side driver circuit 802 and the data signal side driver circuit 803 are inputted from TAB (tape automated bonding) tape 805 through an input wiring 804. Note that, although not shown, instead of the TAB tape 805, a TCP (tape carrier package) in which an IC (integrated circuit) is provided in the TAB tape may be connected with the input wiring.

At this point, reference numeral 806 denotes a cover member provided over the organic EL element shown in FIG. 7. The cover member 806 is adhered to the substrate 701 through a sealing member 807 made of a resin. The cover member 806 may be made of any material which does not transmit moisture and oxygen. In this embodiment, as shown in FIG. 8B, the cover member 806 is made from a plastic member 806a and carbon films (concretely a diamond like carbon films) 806b and 806c provided on the front surface and the rear surface of the plastic member 806a.

Further, as shown in FIG. 8B, the sealing member 807 is covered with a sealing member 808 made of resin such that the organic EL element is completely filled into a closed space 809. The closed space 809 is preferably filled with an inert gas (typically, a nitrogen gas or a rare gas), a resin, or an inert liquid (for example, liquid fluorinated carbon which is presented by perfluoroalkane. It is effective that absorbent or deoxidant is further provided.

Also, a polarization plate may be provided in a display screen (image viewing surface) of the light emitting device described in this embodiment. This polarization plate has an effect that the reflection of light incident from the outside is suppressed and a viewer is prevented from being reflected in the display screen. Generally, a circular polarization plate is used. Note that, in order to prevent the case where light emitted from the organic compound layer is reflected by the polarization plate and returned to the inner portion, it is preferable to use a structure in which the refractive index is adjusted to reduce inner reflection.

Note that, as the organic EL element included in the light emitting device of this embodiment, any one of the organic EL elements disclosed by the present invention may be used.

Embodiment 5

Figure 9A:
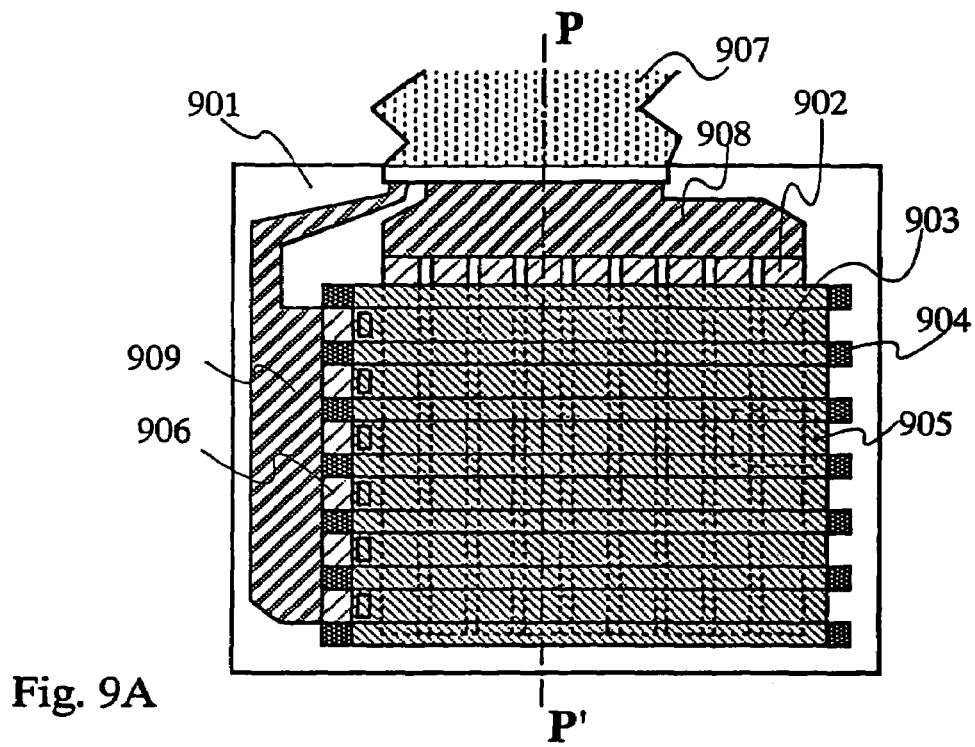
FIGS. 9A to 9C show a top structure and a cross sectional structure of a light emitting device.
Figure 9B:
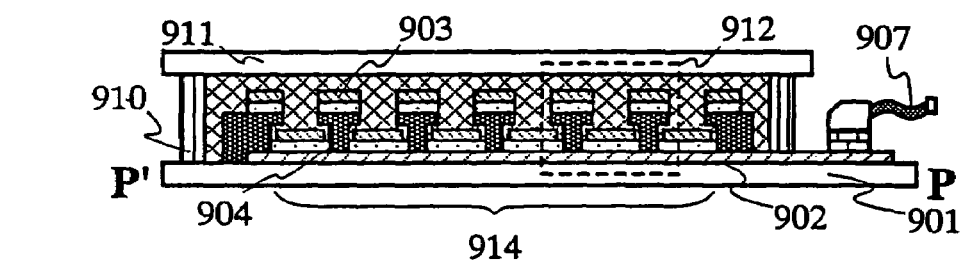

In this embodiment, a passive matrix light emitting device will be described as an example of a light emitting device including an organic EL device disclosed by the present invention, FIG. 9A is a top view thereof and FIG. 9B is a cross sectional view obtained by cutting FIG. 9A along a dashed line P-P'.

In FIG. 9A, reference numeral 901 denotes a substrate and a plastic member is used here. As the plastic member, a plate shaped or a film shaped member made of polyimide, polyamide, acrylic resin, epoxy resin, PES (polyether sulfone), PC (polycarbonate), PET (polyethylene terephthalate) or PEN (polyether nitrile) can be used.

Reference numeral 902 denotes scan lines (anode layers) made from conductive oxide films. In this embodiment, conductive oxide films in which gallium oxide is added to zinc oxide are used. Reference numeral 903 denotes data lines (cathode layers) made from metal films. In this embodiment, an Al:Li alloy films are used. Reference numeral 904 denotes banks made of acrylic resins. The banks 904 function as isolation walls for separating the data lines 903. Both the scan lines 902 and the data line 903 are formed with stripe shapes and provided orthogonal to each other. Note that although not shown in FIG. 9A, an organic compound layer is sandwiched between the scan lines 902 and the data lines 903 and intersection portions 905 become pixels.

The scan lines 902 and the data lines 903 are connected with an external driver circuit through a TAB tape 907. Note that reference numeral 908 denotes a wiring group made from a set of scan lines 902 and reference numeral 909 denotes a wiring group made from a set of connection wirings 906 connected with the data lines 903. Also, although not shown, instead of the TAB tape 907, a TCP in which an IC is provided in the TAB tape may be connected with the scan lines and the data lines.

In FIG. 9B, reference numeral 910 denotes a sealing member and reference numeral 911 denotes a cover member adhered to the plastic substrate 901 through the sealing member 910. A light curable resin is preferably used as the sealing member 910 and a material in which degassing is less and which has low hygroscopicity is preferable. It is preferable that the cover member is made of the same material as the substrate 901 and glass (including quartz glass) or plastic can be used. Here, a plastic member is used.

Figure 9C:
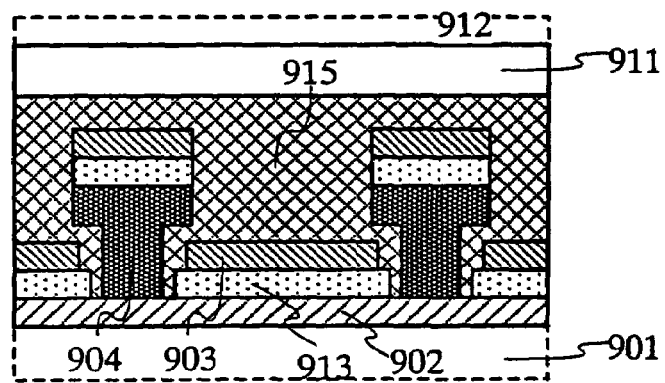

Next, an enlarged view of a structure of a pixel region is shown in FIG. 9C. Reference numeral 913 denotes an organic compound layer. Note that, as shown in FIG. 9C, banks 904 are formed with a shape in which a width of the lower layer is narrower than that of the upper layer, and thus the data lines 903 can be physically separated form each other. A pixel portion 914 surrounded by the sealing member 910 is blocked from outside air by a sealing member 915 made of a resin, and thus a structure is obtained such that deterioration of the organic compound layer is prevented.

In the light emitting device of the present invention having the above structure, the pixel portion 914 is constructed by the scan lines 902, the data lines 903, the banks 904, and the organic compound layer 913. Thus, the light emitting device can be manufactured by a very simple process.

Also, a polarization plate may be provided in a display screen (image viewing surface) of the light emitting device described in this embodiment. This polarization plate has an effect that the reflection of light incident from the outside is suppressed and a viewer is prevented from being reflected in the display screen. Generally, a circular polarization plate is used. Note that, in order to prevent the case where light emitted from the organic compound layer is reflected by the polarization plate and returned to the inner portion, it is preferable to use a structure in which the refractive index is adjusted to reduce inner reflection.

Note that, as the organic EL element included in the light emitting device of this embodiment, any one of the organic EL elements disclosed by the present invention may be used.

Embodiment 6

In this embodiment, an example of a module in which a printed wiring board is provided in the light emitting device described in Embodiment 5 will be described.

Figure 10A:
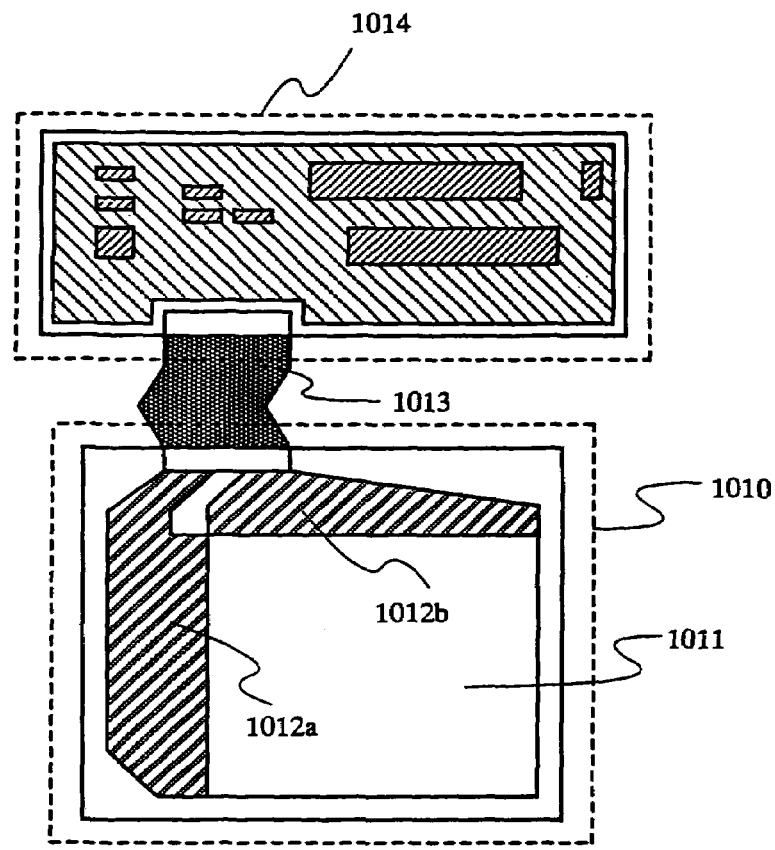
FIGS. 10A and 10B show a structure of a light emitting device.

In a module shown in FIG. 10A, a TAB tape 1013 is attached to a substrate 1010 (here, including a pixel portion 1011 and wirings 1012a and 1012b) and a printed wiring board 1014 is attached to the substrate 1010 through the TAB tape 1013.

Figure 10B:
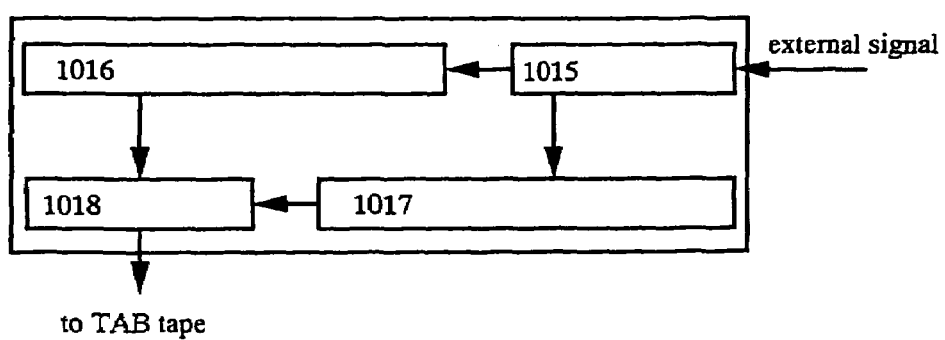

Here, a functional block view of the printed wiring board 1014 is shown in FIG. 10B. An IC which functions as at least I/O ports (input portion and output portion) 1015 and 1018, a data signal side driver circuit 1016, and a gate signal side driver circuit 1017 is provided in the inner portion of the printed wiring board 1014.

Therefore, the module in which the TAB tape is attached to the substrate in which the pixel portion is formed on a substrate surface and the printed wiring board having a function as the driver circuit is attached to the substrate through the TAB tape is called a driver circuit external module in particular in this specification.

Note that, as the organic EL element included in the light emitting device of this embodiment, any one of the organic EL elements disclosed by the present invention may be used.

Embodiment 7

In this embodiment, an example of a module in which a printed wiring board is provided in the light emitting device described in Embodiment 4 or 5 will be described.

Figure 11A:
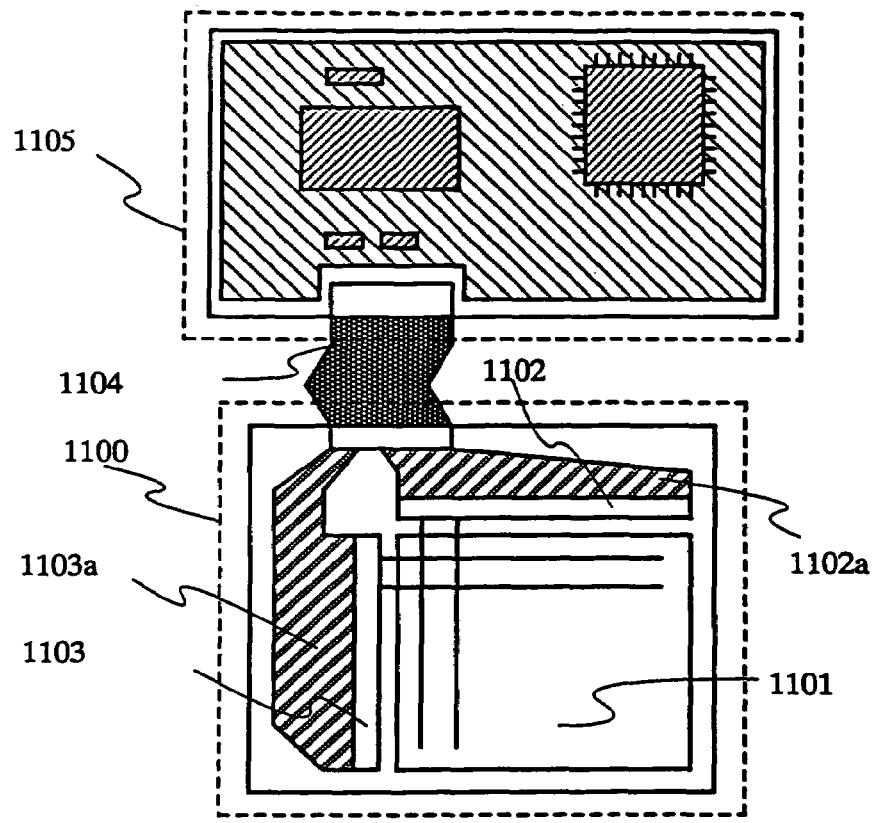
FIGS. 11A and 11B show a structure of a light emitting device.

In a module shown in FIG. 11A, a TAB tape 1104 is attached to a substrate 1100 (here, including a pixel portion 1101, a data signal side driver circuit 1102, a gate signal side driver circuit 1103, and wirings 1102a and 1103a) and a printed wiring board 1105 is attached to the substrate 1100 through the TAB tape 1104. A functional block view of the printed wiring board 1105 is shown in FIG. 11B.

Figure 11B:
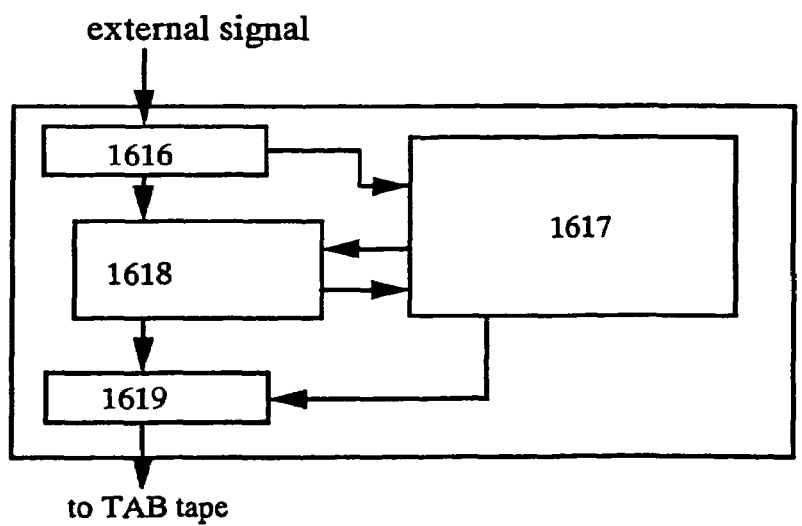

As shown in FIG. 11B, an IC which functions as at least I/O ports 1616 and 1619 and a control portion 1617 is provided in the inner portion of the printed wiring board 1105. Note that, although a memory portion 1618 is provided here, it is not necessarily provided. Also, the control portion 1617 has a function of controlling operations of the driver circuits, correction of image data, and the like.

Therefore, the module in which the printed wiring board having a function as the controller is attached to the substrate in which the organic EL element is formed is called a controller external module in particular in this specification.

Note that, as the organic EL element included in the light emitting device of this embodiment, any one of the organic EL elements disclosed by the present invention may be used.

Embodiment 8

The light emitting device of the present invention, which is described in the above embodiment has advantages being bright and having low consumption power. Thus, electric equipment including the light emitting device as a display device or the like, can be operated with lower consumption power than a conventional appliance. In particular, electric equipment such as a mobile equipment in which a battery is used as a power source is extremely effective. Because the low consumption power directly leads convenience (no battery state is hard to cause).

Since the light emitting device is a self light emission type, a back light in a liquid crystal display device is not required. Also, since a thickness of the organic compound layer does not exceed 1 µm, thinness and weight reduction are allowed. Thus, electric equipment including the light emitting device as a display device or the like is thinner and light in weight as compared with a conventional appliance. In particular, electric equipment such as a mobile equipment is extremely effective, because thinness and light in weight directly leads convenience (light and compact in portage). Further, with respect to electric equipment in general, there is no room for doubt that thinness (not bulk) is effective in view of transportation (mass transportation is allowed) and setting (saving of a space such as a room).

Also, since the light emitting device is a self light emission type, this light emitting device has higher visibility in a light place and a wider view angle, as compared with those of a liquid crystal display device. Therefore, an electric equipment including the light emitting device as a display portion has a large merit in view of display visibility.

In this embodiment, an example of electric equipment including the light emitting device of the present invention as a display portion will be described. Concrete examples are shown in FIGS. 12A to 12F and 13A and 13B. As the organic EL element included in the electric equipment of this embodiment, any one of the structures shown in FIGS. 4 to 6 may be used. Also, as a mode of the light emitting device included in the electric equipment of this embodiment, any one of the modes shown in FIGS. 7 to 11A and 11B may be used.

Figure 12A:
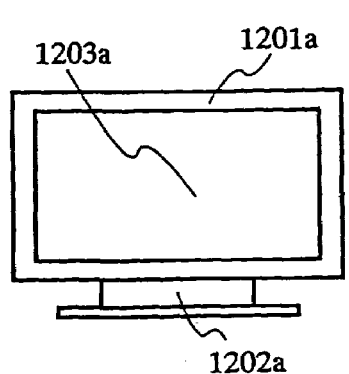
FIGS. 12A to 12F show specific examples of electric equipment.

FIG. 12A shows an organic EL display device including a cabinet 1201a, a support base 1202a, and a display portion 1203a. When a display in which the light emitting device of the present invention is used as the display portion 1203a is manufactured, a thin and lightweight display can be realized. Thus, transportation is easy and space saving at setting the display is allowed.

Figure 12B:
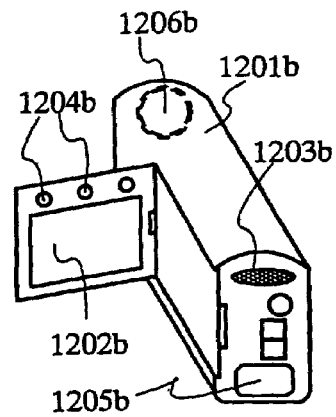

FIG. 12B shows a video camera including a main body 1201b, a display portion 1202b, a voice input portion 1203b, an operational switch 1204b, a battery 1205b, and an image receiving portion 1206b. When a video camera using the light emitting device of the present invention as the display portion 1202b is manufactured, a video camera having low consumption power and being lightweight can be realized. Thus, consumption of a battery is reduced and portage becomes easy.

Figure 12C:
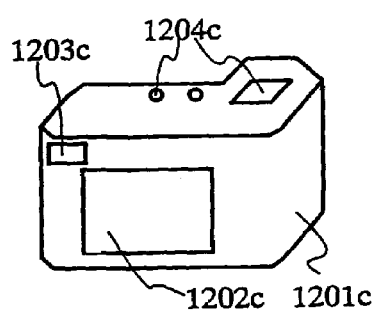

FIG. 12C shows a digital camera including a main body 1201c, a display portion 1202c, an eyepiece portion 1203c, and an operational switch 1204c. When a digital camera using the light emitting device of the present invention as the display portion 1202c is manufactured, a digital camera having low consumption power and being lightweight can be realized. Thus, consumption of a battery is reduced and portage becomes easy.

Figure 12D:
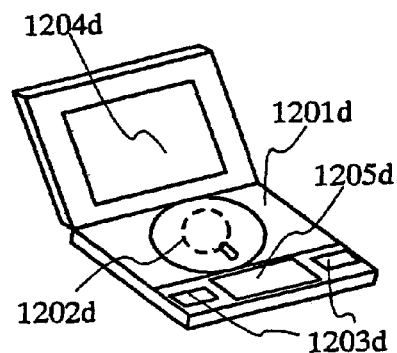

FIG. 12D shows an image reproduction apparatus having a recording medium. The image reproduction apparatus includes a main body 1201d, a recording medium (CD, LD, DVD, or the like) 1202d, an operational switch 1203d, a display portion (A) 1204d, and a display portion (B) 1205d. The display portion (A) 1204d displays mainly image information and the display portion (B) 1205d displays mainly character information. When the image reproduction apparatus using the light emitting device of the present invention as these display portions (A) 1204d and (B) 1205d is manufactured, an image reproduction apparatus having low consumption power and being lightweight can be realized. The image reproduction apparatus having the recording medium includes a CD reproduction apparatus, a game equipment, and the like.

Figure 12E:
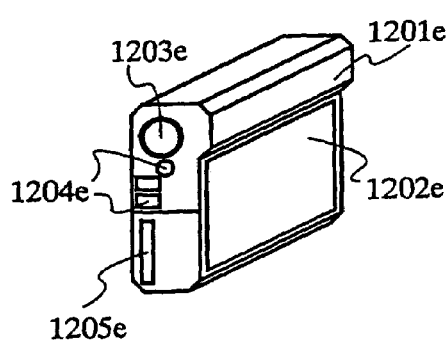

FIG. 12E shows a portable (mobile) computer including a main body 1201e, a display portion 1202e, an image receiving portion 1203e, an operational switch 1204e, and a memory slot 1205e. When a portable computer using the light emitting device of the present invention as the display portion 1202e is manufactured, a portable computer having low consumption power, being thin, and lightweight can be realized. Thus, consumption of a battery is reduced and portage becomes easy. This portable computer can record information in a recording medium into which a flash memory and a non-volatile memory are integrated and reproduce the information.

Figure 12F:
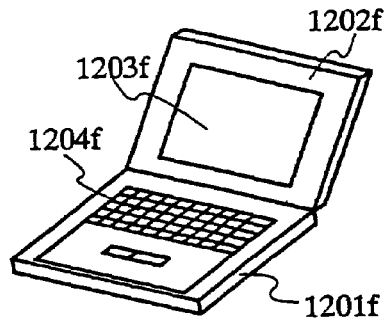

FIG. 12F shows a personal computer including a main body 1201f, a cabinet 1202f, a display portion 1203f, and a keyboard 1204f. When a personal computer using the light emitting device of the present invention as the display portion 1203f is manufactured, a personal computer having low consumption power, being thin, and lightweight can be realized. In particular, when portage use is required as the case of a note personal computer, it is a large merit in view of consumption of a battery and lightness.

In many cases, the above electric equipment displays information distributed through an electronic communication line such as Internet and a radio communication such as radio wave. In particular, the case where moving image information is displayed is increased. A response speed of the organic EL material is very high, and thus it is suitable for such moving image display.

Figure 13A:
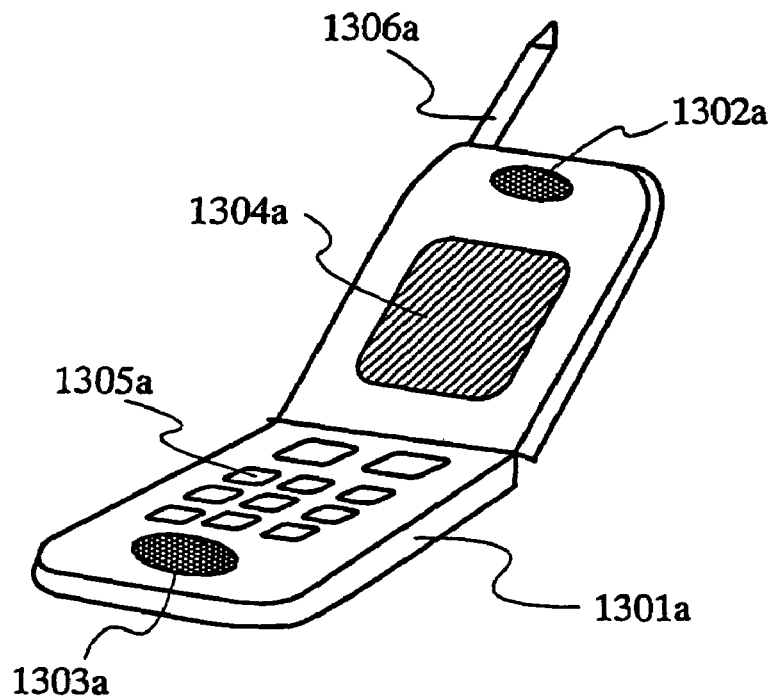
FIGS. 13A and 13B show specific examples of electric equipment.

Next, FIG. 13A shows a mobile telephone including a main body 1301a, a voice output portion 1302a, a voice input portion 1303a, a display portion 1304a, an operational switch 1305a, and an antenna 1306a. When a mobile telephone using the light emitting device of the present invention as the display portion 1304a is manufactured, a mobile telephone having low consumption power, being thin, and lightweight can be realized. Thus, consumption of a battery is reduced, portage becomes easy, and the main body can be made compact.

Figure 13B:
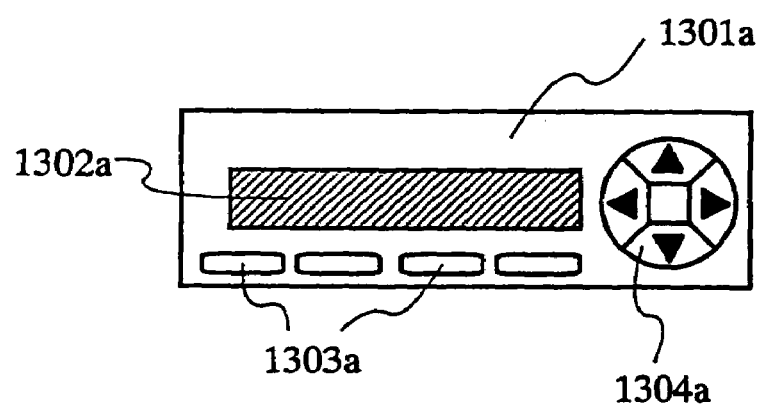

FIG. 13B shows an acoustic equipment (concretely, a vehicle setting audio) including a main body 1301b, a display portion 1302b, and operational switches 1303b and 1304b. When an acoustic equipment using the light emitting device of the present invention as the display portion 1302b is manufactured, an acoustic equipment having low consumption power and being light in weight can be realized. However, in this embodiment, the vehicle setting audio is described as an example. The light emitting device may be used for a home audio.

With respect to the electric equipment as shown in FIGS. 12A to 12F and 13A and 13B, it is effective that a photo sensor is incorporated and a means for detecting brightness in an environment for use is provided and thus a function such as a light emission intensity is modulated in accordance with the brightness in the environment for use is provided. If the intensity with a contrast ratio of 100 to 150 can be obtained as compared with the brightness in the environment for use, a user can recognize an image or character information without causing a problem. That is, when the environment for use is light, the intensity of the image can be increased such that it is easy to view. On the other hand, when the environment for use is dark, the intensity of the image can be reduced and thus consumption power can be suppressed.

Also, since an operation with low consumption power, thinness, and weight reduction are allowed, various electric equipment using the light emitting device of the present invention as a light source are very useful. Typically, with respect to electric equipment including the light emitting device of the present invention as a light source such as a back light or a front light of the liquid crystal display device or a light source of an illumination equipment, realization of low consumption power, thinness, and weight reduction is allowed.

Thus, even in the case where a liquid crystal display is used for all the display portions of the electric equipment which are described in this embodiment and shown in FIGS. 12A to 12F and 13A and 13B, when electric equipment using the light emitting device of the present invention as the back light or the front light of the liquid crystal display is manufactured, electric equipment having low consumption power, being thin, and light in weight can be achieved.

When the present invention is embodied, the light emitting device which is bright and has low consumption power and superior cost efficiency can be obtained. Further, when such a light emitting device is used for a light source or a display portion, the electric equipment, which is bright and has low consumption power and is low in costs can be obtained.

What is claimed is:

1. A method for fabricating a light emitting device comprising the steps of:
   forming an anode layer;
   forming a metal oxide film on said anode layer by anodizing said anode layer, the metal oxide film including a porous body;
   forming an organic compound layer on and in contact with said porous body, after anodizing said anode layer; and
   forming a cathode layer on said organic compound layer,
   wherein said anode layer comprises at least one metal element selected from the group consisting of an element having a metal having an atomic number equal to or larger than rubidium, and groups 4 to 6 elements of a periodic table, and
   wherein at least a part of said organic compound layer is present in said porous body.

2. A method of claim 1, wherein said metal element is one of titanium, tantalum, and tungsten.

3. A method for fabricating a light emitting device comprising the steps of:
   forming a cathode layer;
   forming a metal oxide film on said anode layer by anodizing said cathode layer, the metal oxide film including a porous body;
   forming an organic compound layer on and in contact with, said porous body, after anodizing said cathode layer; and
   forming an anode layer on said organic compound layer,
   wherein said cathode layer comprises at a metal selected from the group consisting of groups 4 to 6 elements of a periodic table, and
   wherein at least a part of said organic compound layer is present in said porous body.

4. A method for fabricating a light emitting device comprising the steps of:
   forming an anode layer;
   forming a metal oxide film on said anode layer by sol-gel method, the metal oxide film including a porous body;
   forming an organic compound layer on said metal oxide film, as said porous body being in contact with said organic compound layer and said anode layer; and
   forming a cathode layer on said organic compound layer,
   wherein said metal oxide film comprises at least one metal element selected from the group consisting of a metal having an atomic number equal to or larger than rubidium, and groups 4 to 6 elements of a periodic table, and
   wherein at least a part of said organic compound layer is present in said porous body.

5. A method of claim 4, wherein said metal element is one of titanium, tantalum, and tungsten.

6. A method for fabricating a light emitting device comprising the steps of:
   forming a cathode layer;
   forming a metal oxide film on and in contact with said cathode layer by a surface sol-gel method, the metal oxide film including a porous body;
   forming an organic compound layer on said metal oxide film, as said organic compound layer being in contact with said porous body; and
   forming an anode layer on said organic compound layer,
   wherein said metal oxide film comprises a metal element having an atomic number equal to or larger than rubidium, and
   wherein at least a part of said organic compound layer is present in said porous body.

7. A method for fabricating a light emitting device comprising the steps of:
   forming a first electrode layer;
   forming a metal oxide film having a porous body on and in contact with said first electrode layer by a surface sol-gel method;
   forming an organic compound layer on said metal oxide film as said organic compound layer is contact with said porous body; and
   forming a second electrode layer on said organic compound layer, wherein said metal oxide film comprises a metal element having an atomic number equal to or larger than rubidium, and
   wherein at least a part of said organic compound layer is present in said porous body.

* * * * *